United States Patent
Peschke et al.

(10) Patent No.: US 8,581,611 B2
(45) Date of Patent: Nov. 12, 2013

(54) OSCILLOSCOPE PROBE

(75) Inventors: Martin Peschke, Munich (DE); Alexander Schild, Feldkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 729 days.

(21) Appl. No.: 12/377,518

(22) PCT Filed: Jul. 5, 2007

(86) PCT No.: PCT/EP2007/005980
§ 371 (c)(1),
(2), (4) Date: Sep. 14, 2010

(87) PCT Pub. No.: WO2008/019731
PCT Pub. Date: Feb. 21, 2008

(65) Prior Publication Data
US 2011/0006793 A1    Jan. 13, 2011

(30) Foreign Application Priority Data
Aug. 14, 2006 (DE) .......... 10 2006 038 026
Nov. 8, 2006 (DE) .......... 10 2006 052 745

(51) Int. Cl.
*G01R 31/20* (2006.01)
(52) U.S. Cl.
USPC .................. 324/754.01; 324/76.11
(58) Field of Classification Search
None
See application file for complete search history.

(56) References Cited

U.S. PATENT DOCUMENTS

| | | | |
|---|---|---|---|
| 4,364,027 A | 12/1982 | Murooka | |
| 4,743,844 A | 5/1988 | Odenheimer et al. | |
| 5,384,532 A | 1/1995 | Uhling | |
| 6,870,359 B1 * | 3/2005 | Sekel | 324/750.02 |
| 8,332,175 B2 * | 12/2012 | Li | 702/105 |
| 2002/0140416 A1 * | 10/2002 | Toriyama et al. | 324/97 |
| 2006/0061348 A1 * | 3/2006 | Cannon et al. | 324/72.5 |
| 2006/0269186 A1 | 11/2006 | Frame et al. | |

FOREIGN PATENT DOCUMENTS

| | | |
|---|---|---|
| EP | 0 241 142 A1 | 3/1987 |
| GB | 2 264 788 A | 2/1992 |

OTHER PUBLICATIONS

International Search Report, PCT/EP2007/005980, Jan. 9, 2008, pp. 1-4.
International Preliminary Report on Patentability, PCT/EP2007/005980, Jun. 11, 2009, pp. 1-9.

* cited by examiner

*Primary Examiner* — Jermele M Hollington
*Assistant Examiner* — Trung Nguyen
(74) *Attorney, Agent, or Firm* — Ditthavong, Mori & Steiner, P.C.

(57) ABSTRACT

Disclosed is a probe (21) for an oscilloscope (24) comprising a multi-stage transistor amplifier (26) which is used as an impedance transformer and the output of which is connected to the oscilloscope (24). An electronic switching device (27) that can be remote-controlled by means of the oscilloscope (24) is assigned to the input ($V_{in}$) of the amplifier (26). Said electronic switching device (27) allows frame potential or a reference voltage to be alternatively connected to the amplifier input ($V_{in}$) instead of the measuring-circuit voltage of the measuring tip (22) such that the direct voltage offset is measured when the amplifier input ($V_{in}$) is connected to frame while the gain error in the oscilloscope (24) is measured when the reference voltage is applied, and said direct voltage offset or gain error is adequately taken into account when the measuring-circuit voltage in the oscilloscope is evaluated.

18 Claims, 4 Drawing Sheets

OSCILLOSCOPE PROBE

CROSS-REFERENCE TO RELATED APPLICATION

The present application claims priority to German Patent Application No. 10 2006 038 026.6, filed on Aug. 14, 2006, German Patent Application No. 10 2006 052 745.3, filed on Nov. 8, 2006, and PCT Application No. PCT/EP2007/005980, filed on Jul. 5, 2007, the entire contents of which are herein incorporated by reference.

BACKGROUND OF THE INVENTION

1. Field of the Invention

The invention relates to a probe for an oscilloscope.

2. Discussion of the Background

In the case of active probes for oscilloscopes, which measure ground-referenced or differential signals, the probe tip picking up the signal to be measured in a high-ohmic manner is connected to an amplifier acting as an impedance converter, of which the output provides a characteristic impedance generally of 50 ohms. The test signal is supplied from the output of this amplifier via a high-frequency cable to the input of the oscilloscope, which terminates the cable with its characteristic impedance, for example, of 50 ohms, in order to avoid reflections. Amplifiers of this kind generally provide a so-called direct-voltage offset error, that is to say, an input voltage of 0 volts does not correspond exactly to an output voltage of 0 volts. Moreover, amplifiers of this kind generally also provide amplification errors, that is to say, with a desired voltage amplification of, for example, one, a 1 volt change of the input voltage does not generate exactly 1 volt change of the output voltage.

In order to keep this error to a minimum, the use of complex amplifier topologies is known from U.S. Pat. No. 5,384,532. For example, in the case of a ground-referenced probe of broad bandwidth, the use of an amplifier, which is constructed as a composite amplifier consisting of a high-frequency path for high-frequencies and a low-frequency path for low frequencies and direct voltages, as an impedance converter, is known. The amplifier in the low-frequency path is an operational amplifier with the minimum possible offset. The high-frequency path for high-frequencies, for example, above 10 MHz, consists of a three-stage emitter-follower with transistors of the npn type and is designed as an AC-coupled amplifier with a blocking capacitor disposed between the probe tip and the amplifier input.

All of these complicated amplifier topologies are not adequate to keep offset errors and amplification errors sufficiently small over a given temperature range. The user must therefore interrupt the measurement before every measurement with the probe and after every temperature change outside a given interval, for example, of 5° C., and implement a manual calibration. If the user does not do so, or if this is not possible, for example, in the case of an automated, long-term measurement without user, false results must be anticipated.

SUMMARY OF THE INVENTION

The object of the invention is therefore to provide an oscilloscope probe of the type mentioned in the introduction with a simple calibration system capable of automatic operation for the removal of offset errors and/or amplification errors.

This object is achieved on the basis of a probe according to the disclosure herein by its characterising features. Advantageous further developments, in particular, also with reference to the possibility of using a DC-coupled amplifier of very simple structure as an impedance converter in the probe are specified herein.

By contrast with the previously-used calibration and compensation measures, the offset error or respectively amplification error in the probe is not compensated in the probe according to the invention; it is merely measured in the oscilloscope, where it is taken into consideration in the actual evaluation of the measured values. This can be implemented in a fully-automatic manner and, in fact, from the oscilloscope, by an automatic remote-control of the switching device disposed at the input of the amplifier. This switching device places the input of the probe at ground potential or at a defined direct voltage. Accordingly, offset and amplification errors can be measured directly in the oscilloscope. Since the evaluation and graphic display of the measured values is generally provided digitally in modern oscilloscopes, this consideration of the measured and digitized offset or respectively amplification error is readily possible in the oscilloscope through an appropriate design of the software. However, a compensation of the offset by means of the hardware of the oscilloscope input is also possible. The offset error occurring at the output of the amplifier with an input voltage of 0 volt occurs for reasons of circuit technology, manufacturing tolerances and temperature dependence of the amplifier and of any input divider, which may be present. It must be only small enough in order still to be tolerated by the input of the oscilloscope (for example, ±1 volt).

With the type of measurement and consideration of the offset error or respectively amplification error according to the invention, the user can avoid the troublesome, manual calibration before the initial measurement and after every change of temperature. Moreover, with a probe according to the invention, automated procedures such as temperature-dependent measurements can be implemented without the need for a user to implement the calibrations. One particular advantage of the invention is that not only the offset error or respectively amplification error of the amplifier used in the probe can be determined and taken into consideration in the subsequent measurement, but also the offset or respectively amplification error of subsequent amplifier stages in the oscilloscope itself. In this manner, a total offset error or respectively a total amplification error can be determined and taken into consideration starting from the probe tip through to the display of a measured value in the oscilloscope. One further advantage of the invention is that the amplifier can have a very simple structure, because no offset-compensating measures need to be adopted. An amplifier of this kind provides improved properties with regard to input capacity, input resistance, bandwidth and frequency response.

According to a further development of the invention, it has proved advantageous to use as an impedance-converting amplifier a DC-coupled amplifier of simple design, which is constructed either from bipolar transistors in an emitter-follower circuit and/or from field-effect transistors in a source-follower circuit and optionally diodes or resistors, and of which the successive amplification elements are dimensioned and matched to one another in such a manner that the resulting offset direct voltage is a minimum. With an amplifier of this kind, extremely broad bandwidths can be realised without transfer distortions.

BRIEF DESCRIPTION OF THE DRAWINGS

The invention is explained in greater detail below with reference to schematic drawings of exemplary embodiments. The drawings are as follows.

DETAILED DESCRIPTION OF EXEMPLARY EMBODIMENTS OF THE INVENTION

Figure 1:
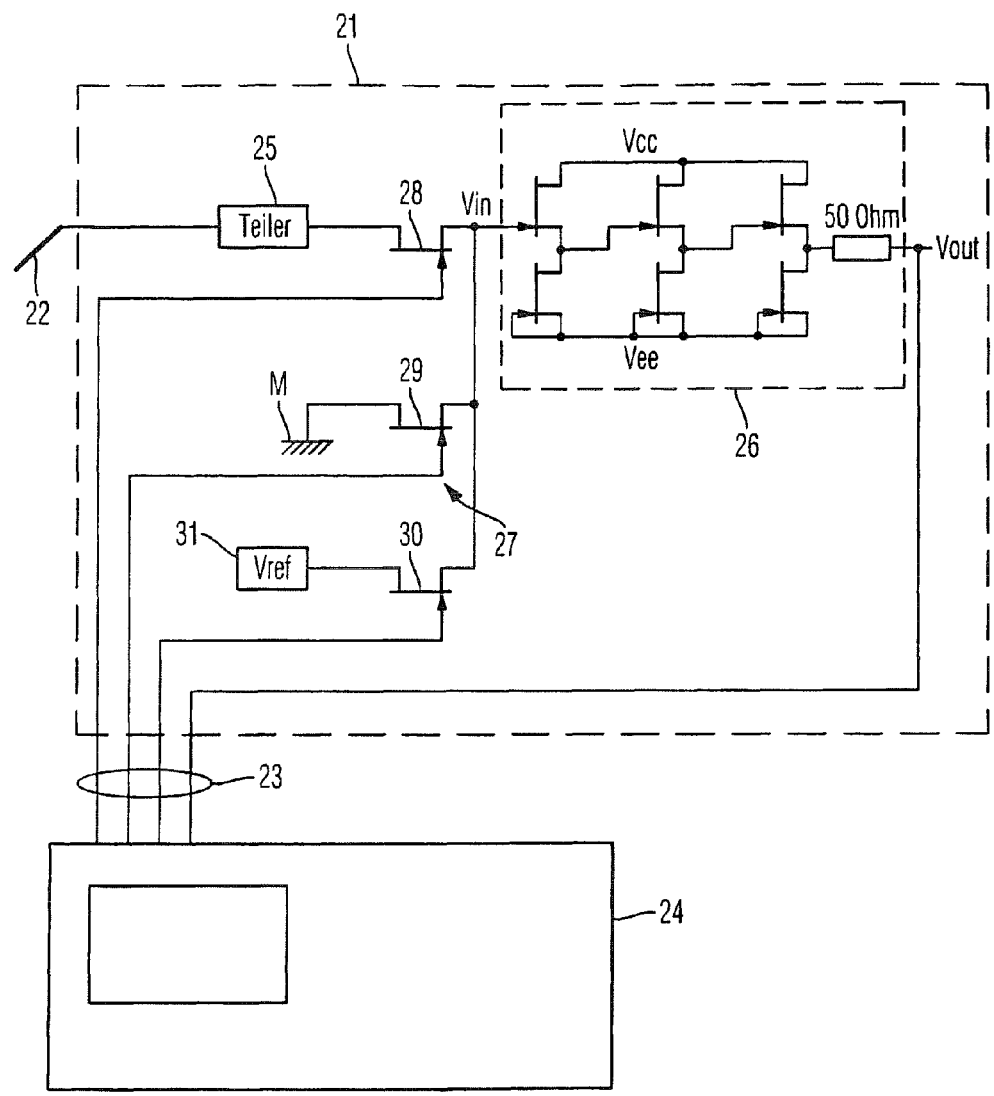
FIG. 1 shows a ground-referenced probe according to the invention for an oscilloscope.

FIG. 1 shows a probe 21 with a probe tip 22, which is connected via a multi-core cable 23 to the actual oscilloscope 24. The measured value picked up via the probe tip 22 is preferably supplied via an input divider 25 to the input $V_{in}$ of an amplifier 26 acting as an impedance converter, which supplies the test signal picked up in a high-ohmic manner at its output $V_{out}$ with a characteristic impedance, for example, of 50 ohms via the cable 23 to the oscilloscope 24. In the oscilloscope 24, the test signal is digitally conditioned and presented on a screen. In the exemplary embodiment presented, the amplifier 26 consists of three field-effect transistors in a source-follower circuit and is constructed, for example, in HEMT or JFET technology, of which the bias current is adjusted by the FET current sources in such a manner that the gate-source voltage of every stage is approximately equal to zero.

An electronic switching device 27, which is remote-controllable from the oscilloscope 24 via control lines of the cable 23, is provided at the input $V_{in}$ of the amplifier 26. This switching device 27 consists of three field-effect transistor switches 28, 29, 30. With a closed FET switch 28 and open switches 29, 30, the signal to be measured is supplied from the probe tip 22 to the input $V_{in}$ of the amplifier 26; with switch 28 and 30 open, ground potential M is supplied to the input $V_{in}$ via the closed switch 29; and with open switches 28 and 29 and closed switch 30, a constant reference voltage $V_{ref}$ is supplied to the input $V_{in}$ from a reference frequency source 31. Accordingly, the switch 29 is used for the measurement of the offset error of the amplifier 26 in the oscilloscope 24. By applying a reference voltage via the switch 30, the amplification error of the amplifier 26 can be measured in the oscilloscope 24. These measurements can be implemented at any required time. An additional measuring device is superfluous, because these measurements can be implemented directly through the oscilloscope 24, which is present anyway. It is also conceivable to supply several different reference voltages to the input of the amplifier via additional switches. If only one measurement of the offset error is required, the additional switch 30 for the reference frequency can also be omitted, and only the switch 29 need be provided.

Figure 7:
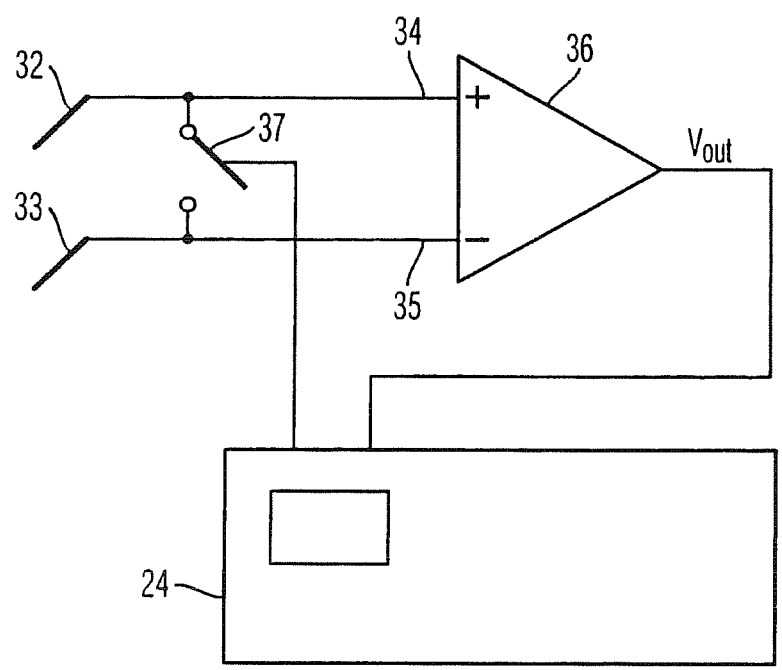
FIG. 7 shows a differential probe according to the invention for an oscilloscope.

The principle according to the invention is suitable not only for ground-referenced probes, but, as shown in FIG. 7, also for differential probes with two probe tips 32, 33 and a differential amplifier 36. In this case, the two inputs 34, 35 are short-circuited directly via a switching device 37, or both inputs 34, 35 are connected individually to ground, and positive and negative reference voltages are connected.

In the case of an arrangement of a divider 25, the switching device 27, can also be arranged upstream of the latter, so that an offset or respectively amplification error of the divider 25 is also included in the measurement.

The consideration according to the invention of the measured offset error or respectively measured amplification error allows the use of a simple DC-coupled amplifier in an emitter-follower or source-follower circuit. FIGS. 2 to 6 show some relevant examples.

Figure 2:
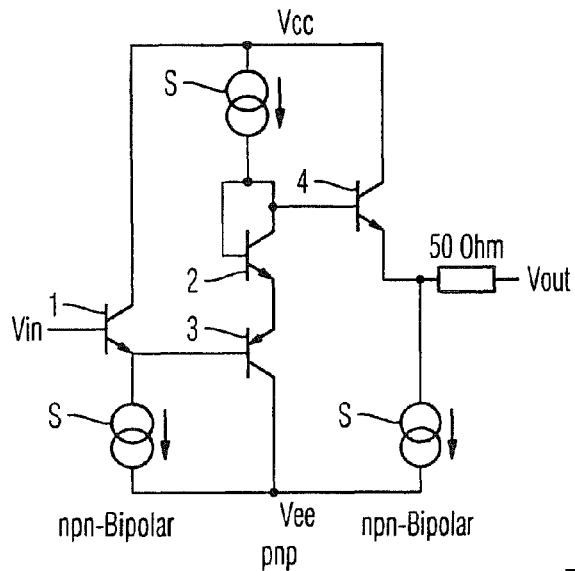
FIGS. 2 to 6 show exemplary embodiments of a DC-coupled amplifier capable of being used for the invention constructed from bipolar transistors and/or field-effect transistors and respectively diodes and resistors.

FIG. 2 shows a DC-coupled amplifier consisting of three bipolar transistors 1, 3 and 4 operated in an emitter circuit and one bipolar transistor 2 operated as a diode with collector-base short-circuit. The input transistor 1, to which the input voltage $V_{in}$ is supplied from the probe tip of the probe, is of the npn type; the follower transistor 3 is of the pnp type, and the output transistor is once again of the npn type. Adjustment of the operating points is implemented via the current sources S. The base-emitter voltage of the transistors 1, 2 and 4 in the example is +0.8 volts, that of the transistors 3 is −0.8 volts. This results in an offset direct voltage of approximately 0 volts.

Figure 3:
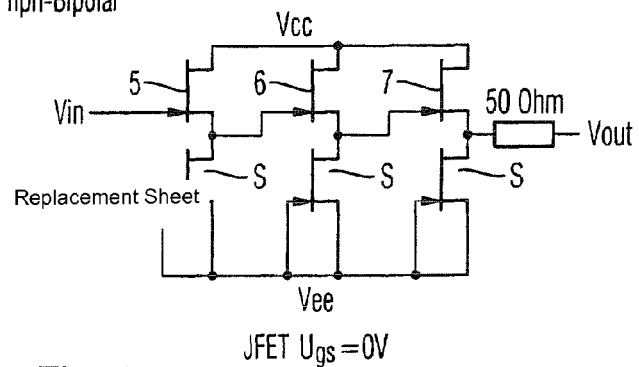

In the case of the self-conducting source-follower circuit according to FIG. 3 constructed from JFET or HEMT field-effect transistors 5, 6, 7, the source current is selected in such a manner that the gate-source voltage $U_{gs}$ is 0 volts. This is possible, for example, through the use of paired field-effect transistors as current sources S, of which the gate-source voltage is set to 0 volts. With this circuit according to FIG. 3, an offset of approximately 0 volts is therefore also achieved.

Figure 4:
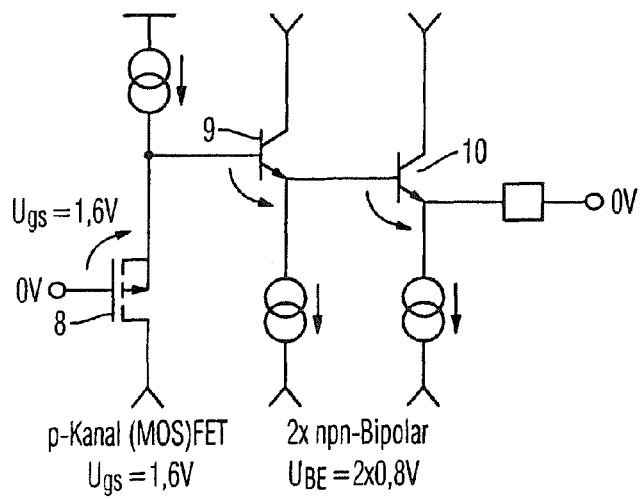

FIG. 4 shows a DC-coupled amplifier consisting of a MOS-FET transistor 8 of the p-channel type, which provides a gate-source voltage of approximately 1.6 volts, followed by two bipolar npn transistors 9 and 10 arranged in an emitter-follower circuit, which together provide a base-emitter voltage of −1.6 volts. Here also, an offset of approximately 0 volts is achieved.

Figure 5:
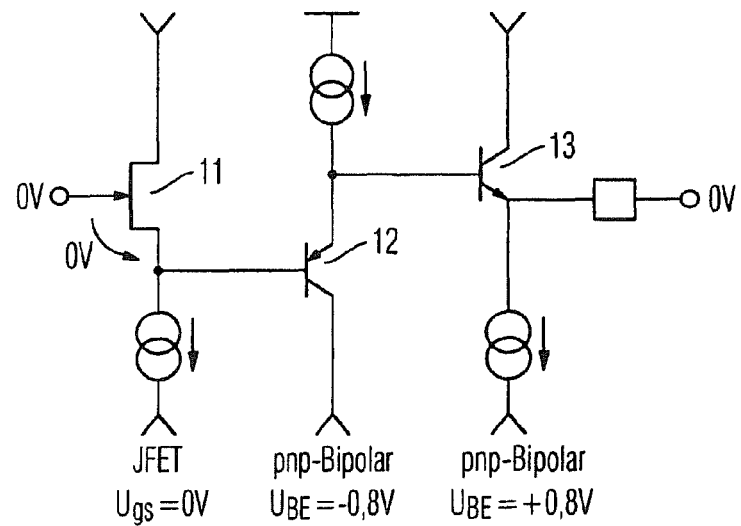

According to FIG. 5, a JFET field-effect transistor 11 is connected to two bipolar transistors 12 and 13 in each case of different conductivity type, here also, an offset of approximately 0 volts is obtained in total.

Figure 6:
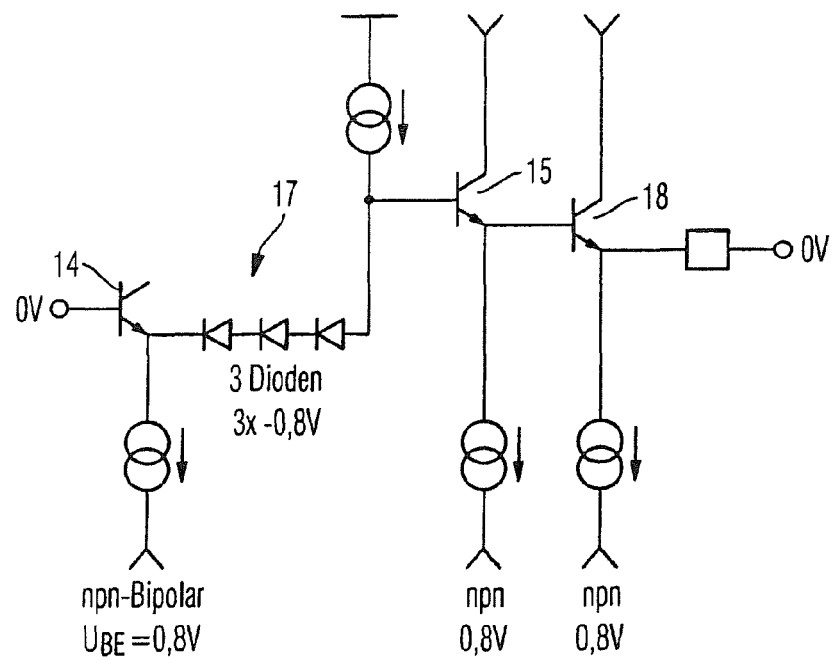

Finally, FIG. 6 shows the combination of bipolar transistors 14 to 16 of the same (npn) conductivity type with three diodes 17. The sequence of base-emitter voltages with the rectified voltages of the diodes once again results in an offset of approximately 0 volt.

Another input divider 5, which is connected between the probe tip and the amplifier input $V_{in}$, can also be arranged in the probe upstream of the amplifier. In this case, the switching device can be provided either upstream or downstream of the input divider.

All the elements of the probe according to the invention such as amplifier, switching device for offset measurement, input divider and similar can be constructed on the substrate as hybrids. The divider can therefore, for example, be constructed in thin-layer or thick-layer technology; the amplifier as a bipolar IC. It is also conceivable to construct the input divider with the amplifier and the circuit for offset measurement on a chip in monolithic integration.

The invention is not restricted to the exemplary embodiments presented. All of the features described and illustrated can be combined with one another as required within the framework of the invention.

The invention claimed is:

1. A probe for ground-referenced signals for an oscilloscope with a multi-stage transistor amplifier acting as an impedance converter, of which the output is connected to the oscilloscope, said probe comprising:
   a switching device remote-controllable via the oscilloscope, and through which ground potential and a reference voltage can be connected to the amplifier input instead of the test voltage of a probe tip, is allocated to the input of the amplifier, wherein the amplifier is a DC-coupled emitter-follower circuit constructed from bipolar transistors or a DC-coupled source-follower circuit constructed from field-effect transistors or a circuit built up from these two circuits, of which the successive amplifier elements are dimensioned and matched to one another in such a manner that the resulting offset direct voltage between the input and the output is minimal.

2. A probe for differential signals for an oscilloscope with a multi-stage transistor amplifier acting as an impedance converter, of which the output is connected to the oscilloscope, said probe comprising:

a switching device allocated to the two differential inputs of the amplifier, and wherein this switching device is remote-controllable in such a manner that instead of the test voltage of the probe tips, both inputs are short-circuited relative to one another or can be connected individually to ground and/or to two arbitrary reference voltages, wherein the amplifier is a DC-coupled emitter-follower circuit constructed from bipolar transistors or a DC-coupled source-follower circuit constructed from field-effect transistors or a circuit built up from these two circuits, of which the successive amplifier elements are dimensioned and matched to one another in such a manner that the resulting offset direct voltage between the input and the output is minimal.

3. The probe according to claim 1,
wherein, in the case of a connection of ground potential to the amplifier input, the direct-voltage offset in the oscilloscope is measured and taken into consideration accordingly in the evaluation of the test voltage in the oscilloscope.

4. The probe according to claim 1,
wherein, in the case of a connection of a reference voltage to the amplifier input, the amplification error in the oscilloscope is measured and taken into consideration accordingly in the evaluation of the test voltage in the oscilloscope.

5. The probe according to claim 1,
wherein the switching device consists of field-effect transistor switches, MEMS switches or relays, which are remote-controllable via control lines connected to the oscilloscope.

6. The probe according to claim 1,
wherein a voltage divider is arranged between the switching device and the probe tip and/or amplifier input.

7. The probe according to claim 1,
wherein the transistors of the emitter-follower or respectively source-follower circuits are mixed in such a manner with interconnected diodes and/or resistors that the offset direct voltages is minimal.

8. The probe according to claim 1,
wherein the amplifier is an emitter-follower circuit constructed from several bipolar transistors, and the successive transistors are selected in such a mixed manner from npn- or respectively pnp-conductivity type that the sum of the successive base-emitter voltages is minimal.

9. The probe according to claim 1,
wherein the amplifier is a self-conducting source-follower circuit consisting of several field-effect transistors, of which the source currents are selected in such a manner that the gate-source voltages of the individual transistors and therefore also their sum is approximately 0 volts.

10. The probe according to claim 1,
wherein the DC-coupled amplifier consists of a mixture of bipolar transistors and field-effect transistors and optionally diodes and/or resistors, which are dimensioned and matched to one another in such a manner that the sum of the successive base-emitter voltages, gate-source voltages and optionally rectified voltages of the diodes or respectively voltages of the resistors is approximately 0 volt.

11. The probe according to claim 2,
wherein, in the case of a connection of ground potential to the amplifier input, the direct-voltage offset in the oscilloscope is measured and taken into consideration accordingly in the evaluation of the test voltage in the oscilloscope.

12. The probe according to claim 2,
wherein, in the case of a connection of a reference voltage to the amplifier input, the amplification error in the oscilloscope is measured and taken into consideration accordingly in the evaluation of the test voltage in the oscilloscope.

13. The probe according to claim 2,
wherein the switching device consists of field-effect transistor switches, MEMS switches or relays, which are remote-controllable via control lines connected to the oscilloscope.

14. The probe according to claim 2,
wherein a voltage divider is arranged between the switching device and the probe tip and/or amplifier input.

15. The probe according to claim 2,
wherein the transistors of the emitter-follower or respectively source-follower circuits are mixed in such a manner with interconnected diodes and/or resistors that the offset direct voltages is minimal.

16. The probe according to claim 2,
wherein the amplifier is an emitter-follower circuit constructed from several bipolar transistors, and the successive transistors are selected in such a mixed manner from npn- or respectively pnp-conductivity type that the sum of the successive base-emitter voltages is minimal.

17. The probe according to claim 2,
wherein the amplifier is a self-conducting source-follower circuit consisting of several field-effect transistors, of which the source currents are selected in such a manner that the gate-source voltages of the individual transistors and therefore also their sum is approximately 0 volts.

18. The probe according to claim 2,
wherein the DC-coupled amplifier consists of a mixture of bipolar transistors and field-effect transistors and optionally diodes and/or resistors, which are dimensioned and matched to one another in such a manner that the sum of the successive base-emitter voltages, gate-source voltages and optionally rectified voltages of the diodes or respectively voltages of the resistors is approximately 0 volt.

* * * * *